(12) United States Patent
Nakauchi (10) Patent No.: US 7,602,473 B2
(45) Date of Patent: Oct. 13, 2009

(54) EXPOSURE APPARATUS AND DEVICE MANUFACTURING METHOD USING THE SAME

(75) Inventor: Akihiro Nakauchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 246 days.

(21) Appl. No.: 11/409,537

(22) Filed: Apr. 21, 2006

(65) Prior Publication Data

US 2006/0238737 A1   Oct. 26, 2006

(30) Foreign Application Priority Data

Apr. 25, 2005   (JP)   ............... 2005-126391

(51) Int. Cl.
*G03B 27/42* (2006.01)
(52) U.S. Cl. ............... 355/67; 355/53; 362/268
(58) Field of Classification Search ............... 355/53, 355/55, 67; 362/268
See application file for complete search history.

(56) References Cited

U.S. PATENT DOCUMENTS

| | | | |
|---|---|---|---|
| 5,835,217 A | 11/1998 | Medecki | |
| 6,100,961 A * | 8/2000 | Shiraishi et al. | 355/67 |
| 6,452,661 B1 | 9/2002 | Komatsuda | |
| 6,833,904 B1 * | 12/2004 | Komatsuda | 355/67 |
| 6,885,432 B2 | 4/2005 | Tsuji | |
| 2002/0001088 A1 | 1/2002 | Wegmann et al. | |
| 2002/0044287 A1 * | 4/2002 | Otaki | 356/521 |
| 2003/0031017 A1 * | 2/2003 | Tsuji | 362/268 |
| 2003/0174303 A1 * | 9/2003 | Naulleau | 355/71 |
| 2004/0174533 A1 | 9/2004 | Nakauchi | |
| 2005/0190378 A1 | 9/2005 | Nakauchi | |

FOREIGN PATENT DOCUMENTS

| | | |
|---|---|---|
| EP | 1280008 A2 | 1/2003 |
| EP | 1355194 A2 | 10/2003 |
| EP | 1387220 A2 | 2/2004 |
| JP | 8-298238 A | 11/1996 |
| JP | 11-312638 A | 11/1999 |
| JP | 2000-97622 A | 4/2000 |
| JP | 2003-302205 A | 10/2003 |
| JP | 2003-309057 A | 10/2003 |

\* cited by examiner

*Primary Examiner*—Diane I Lee
*Assistant Examiner*—Steven H Whitesell-Gordon
(74) *Attorney, Agent, or Firm*—Canon U.S.A., Inc., I.P. Division (57) ABSTRACT

An exposure apparatus includes an illumination optical system adapted to illuminate a reflection mask with light from an exposure light source, and a projection optical system adapted to project a pattern image of the reflection mask disposed in an object plane onto a substrate disposed in an image plane. The illumination optical system includes a reflection integrator adapted to form a plurality of secondary light sources with the light from the exposure light source, a condenser unit adapted to superimpose beams of light from the secondary light sources with one another on the reflection mask, and a mirror capable of being disposed in an optical path instead of the reflection integrator. When the mirror is disposed in the optical path, an illuminated area formed in the object plane of the projection optical system is reduced in comparison with that formed when the reflection integrator is disposed in the optical path.

12 Claims, 10 Drawing Sheets

EXPOSURE APPARATUS AND DEVICE MANUFACTURING METHOD USING THE SAME

BACKGROUND OF THE INVENTION

1. Field of the Invention

The present invention generally relates to an exposure apparatus and a device manufacturing method using the exposure apparatus. More particularly, though not exclusively, the present invention relates to an exposure apparatus utilizing, as exposure light, light in an extreme ultraviolet range (EUV light) with a wavelength of between 5 nm and 20 nm, and a method of manufacturing a device, such as a semiconductor device or a liquid crystal display device, by using the exposure apparatus.

2. Description of the Related Art

To meet demands for finer device patterns, the wavelength of light used as exposure light in an exposure apparatus has become shorter and shorter.

Recently, various proposals have been made with regards to an exposure apparatus using, as exposure light, the EUV light with a wavelength of 5 nm to 20 nm (hereinafter referred to as an "EUV exposure apparatus") (see, e.g., Japanese Patent Laid-Open No. 2003-309057).

In the EUV exposure apparatus, because there are no materials having refractive indices practically adapted for the EUV light, a transmission optical system (dioptric system) cannot be employed as an illumination optical system for illuminating a mask (reticle) with light from an exposure light source, and a reflection optical system using a mirror coated with a reflection multilayered film is employed as the illumination optical system.

For the same reason, a reflection optical system using a plurality of mirrors is employed as a projection optical system for projecting a mask pattern onto a substrate, such as a wafer or a glass plate.

Each mirror has a multilayered reflection film made up of several tens of layers each formed of a Mo/Si pair, and it reflects the EUV light with a equivalently high refractive index.

Figure 2:
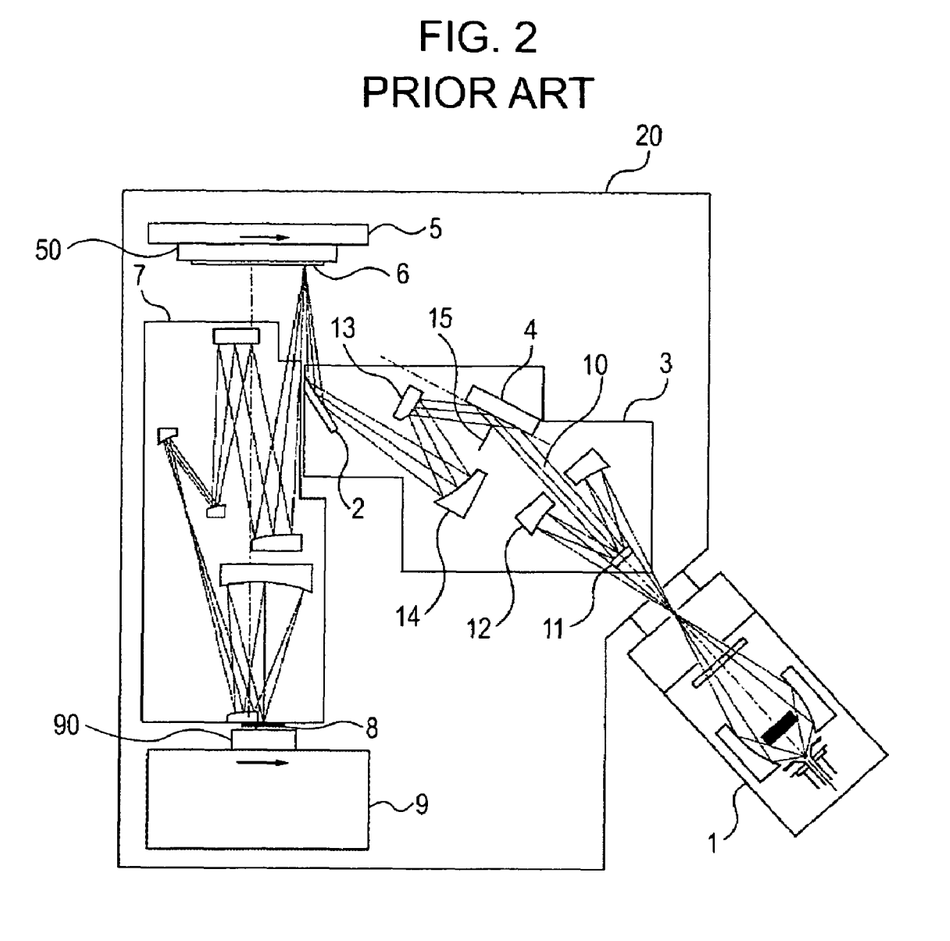
FIG. 2 is an explanatory view of a known exposure apparatus.

FIG. 2 illustrates an EUV exposure apparatus discussed in Japanese Patent Laid-Open No. 2003-309057. In FIG. 2, an exposure light source unit 1 for emitting EUV light includes, e.g., a discharge-produced plasma light source in which Xe gas or Sn vapor is brought into a plasma state with a discharge, thus generating the EUV light, or a laser-produced plasma light source in which a high-power pulse laser beam is condensed and irradiated to Xe or Sn, thus producing plasma.

An illumination optical system 3 includes a plurality of mirrors. A convex mirror 11 and a concave mirror 12 constitute a parallel conversion unit for receiving a beam of EUV light emitted from the light source unit 1 and converting it to a substantially parallel light beam. A reflection integrator 4 has a plurality of cylindrical reflection surfaces. Above the reflection surfaces of the integrator 4, an aperture stop 15 is disposed with its opening surface positioned substantially perpendicular to the integrator front face. The aperture stop 15 specifies a distribution shape of an effective light source and also specifies an angle distribution of the light that illuminates respective points on a reflection mask (reticle) 6, i.e., a surface to be illuminated.

A convex mirror 13, a concave mirror 14, and a plane mirror (folding mirror) 2 constitute a condenser unit for condensing the light beam from the integrator 4 into a circular arc shape. The plane mirror 2 reflects the image-side light beam in the condenser unit upwards so as to enter the reflection mask 6 at a predetermined angle.

The reflection mask 6 is held by a mask chuck 50 provided on a mask stage 5. A projection optical system 7 is a coaxial optical system constituted by a plurality of mirrors coated with multilayered films. The projection optical system 7 is designed such that the object side is non-telecentric and the image side is telecentric.

A wafer 8 coated with a photosensitive material is held by a wafer chuck 90 provided on a wafer stage 9. A vacuum chamber 20 keeps the interior of the entire exposure apparatus in a vacuum state.

Figure 3:
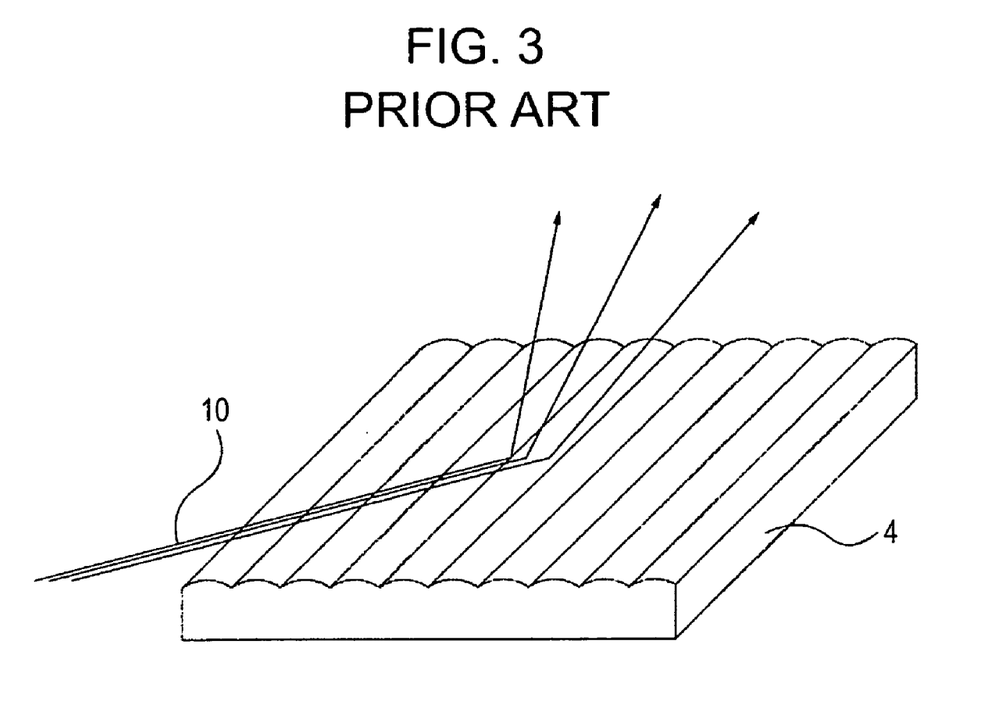
FIG. 3 is a schematic view of a known reflection integrator.

FIG. 3 is a schematic perspective view of the reflection integrator 4, which can have a plurality of convex cylindrical surfaces, in a state where a substantially parallel EUV light beam 10 enters the integrator 4. The substantially parallel EUV light beam 10 enters the integrator 4 in a direction as shown.

As illustrated in FIG. 3, when the substantially parallel EUV light beam 10 enters the integrator 4, which can have the plurality of convex cylindrical surfaces, a plurality of linear secondary light sources are formed near the integrator front face, and respective EUV light beams radiated from the plurality of secondary light sources have an angle distribution in the form of a conical surface. Those EUV light beams are reflected by a mirror, which can have a focal point matched with the positions of the secondary light sources, so as to illuminate the reflection mask 6. Thus, the light beams from the plurality of secondary light sources are superimposed with one another on the reflection mask 6 such that the mask can be illuminated in the circular arc shape.

Various proposals have also been made regarding methods for measuring optical performance of the projection optical system in the EUV exposure apparatus (see, e.g., Japanese Patent Laid-Open No. 2000-97622, Japanese Patent Laid-Open No. 2003-302205, U.S. Patent Application No. 2002/0001088, and U.S. Pat. No. 5,835,217).

Known interferometers for measuring a wavefront aberration of the projection optical system in the known EUV exposure apparatus will be described below.

Figure 7:
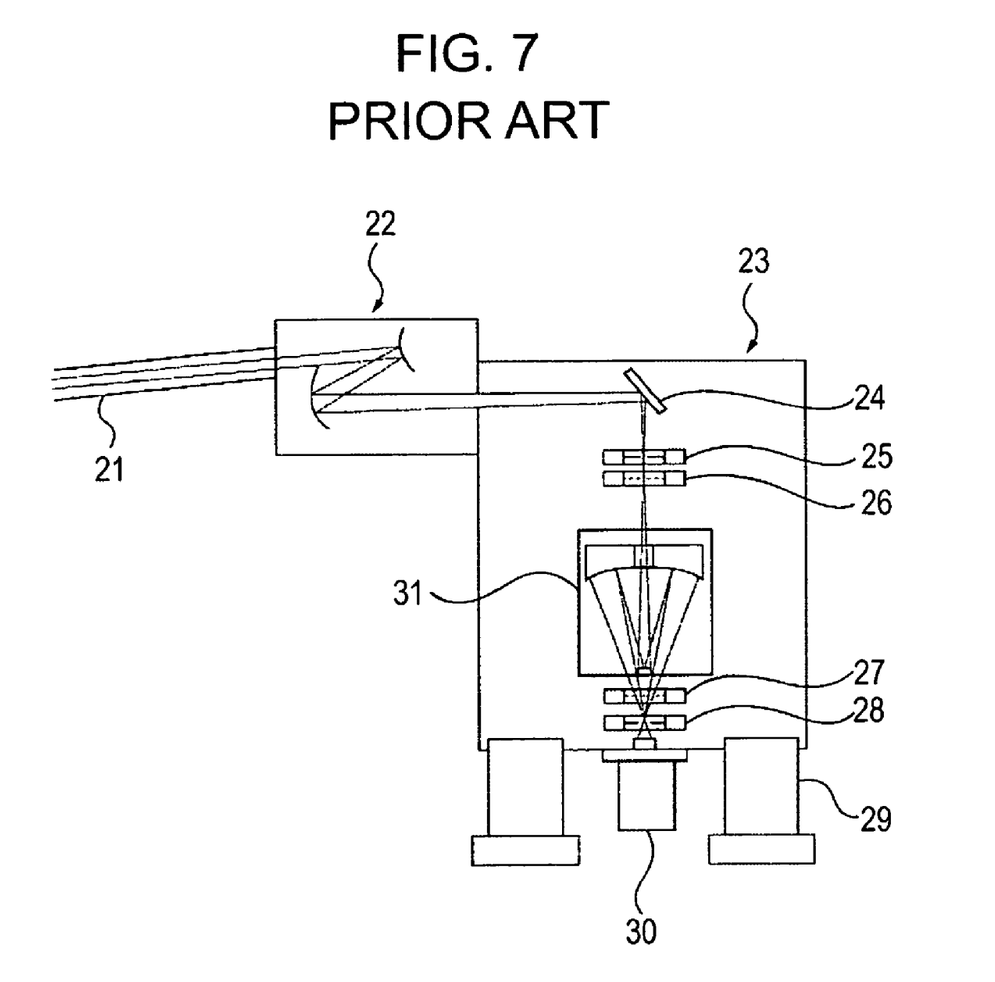
FIG. 7 is a schematic view of a known transmitted wavefront measuring apparatus.

Interferometers for measuring a wavefront aberration of the projection optical system in the EUV exposure apparatus include, for example, a shearing interferometer, a point diffraction interferometer (PDI), and a line diffraction interferometer (LDI), each of which employs a combination of SOR (Synchrotron Orbit Radiation) and UNDULATOR as a light source. FIG. 7 is a conceptual view of an interferometer for measuring a wavefront aberration of an optical system to be tested. EUV light 21 generated by the combination of SOR and UNDULATOR is introduced to a vacuum chamber 23 through an illumination optical system 22. After being reflected by a folding mirror 24, the EUV light 21 passes an optical system 31 to be tested and is detected by a detector 30, e.g., a CCD (Charge Coupled Device). A first mask 25, which can have a pinhole or a window, a first diffraction grating 26, a second diffraction grating 27, and a second mask 28, which can have a pinhole or a window are disposed, as required, in an optical path as shown. The vacuum chamber 23 is supported by a vibration isolation base 29. In the interferometer shown in FIG. 7, a projection optical system using two mirrors is disposed as the tested optical system 31.

Figure 8A:
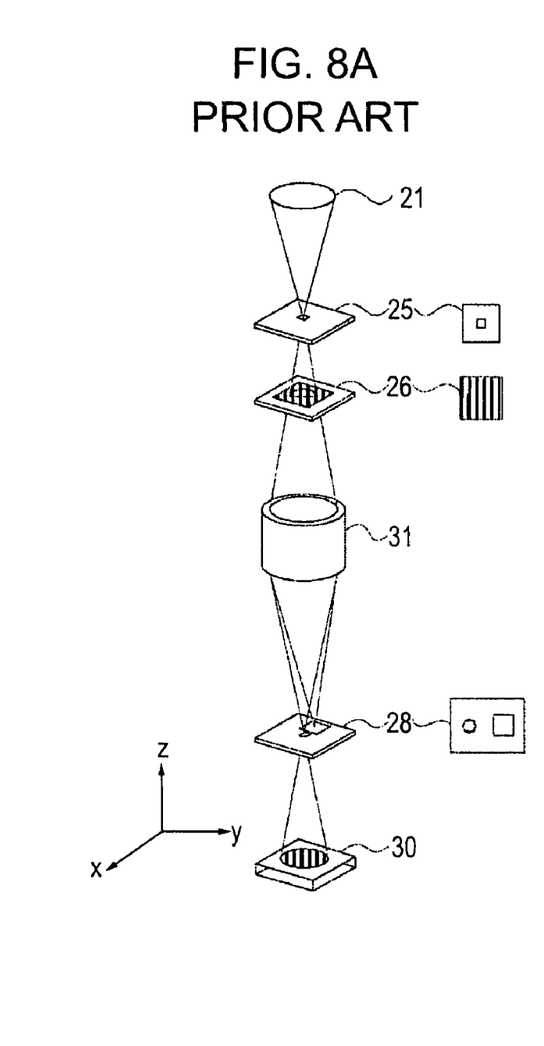
FIG. 8A is an explanatory view of a known PDI.
Figure 8B:
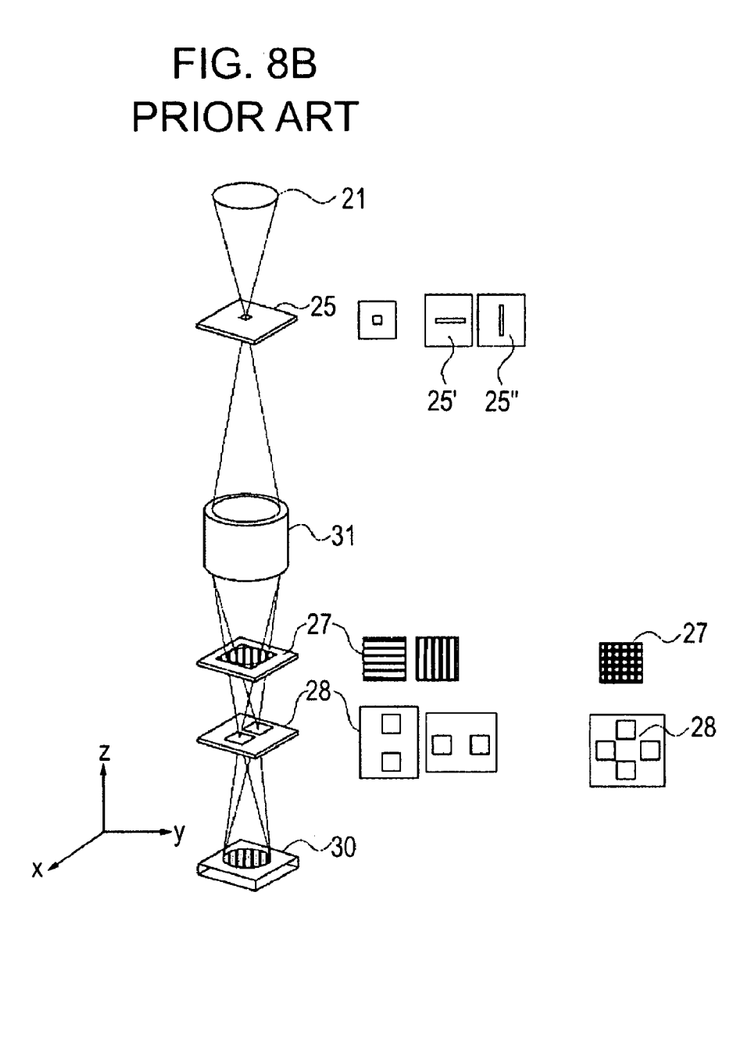
FIG. 8B is an explanatory view of a known LSI.

The interferometer of FIG. 7 is able to evaluate the tested optical system 31 in accordance with plural types of interferometry. FIGS. 8A and 8B are conceptual views of two typical types of interferometry.

FIG. 8A shows a PDI (Point Diffraction Interferometer), and FIG. 8B shows an LSI (Lateral Shearing Interferometer).

In these figures, the same parts as those in FIG. 7 are denoted by the same reference numerals.

The PDI will be first described with reference to FIG. 8A. The light 21 from the light source is condensed onto the first mask 25 disposed in an object plane of the tested optical system 31. The first mask 25 has a pinhole formed therein with a diameter of not larger than a diffraction limit (i.e., not larger than λ/2NA where NA is the numerical aperture of the tested optical system 31 and λ is the wavelength of the light 21). After passing the pinhole of the first mask 25, the light 21 is shaped to a substantially ideal spherical wave. The light having passed the first mask 25 is diffracted by the first diffraction grating 26 to enter the tested optical system 31, and is condensed onto the second mask 28 disposed on an image plane of the tested optical system 31. The second mask 28 has a pinhole formed therein with a diameter of not larger than the diffraction limit and a window formed therein with a size sufficiently larger than the diffraction limit. Because the light condensed onto the second mask 28 has been diffracted by the first diffraction grating 26, plural beams of light are condensed to respective positions on the second mask 28 depending on the order of diffraction. The second mask 28 and the first diffraction grating 26 are aligned with each other such that the light of 0th order passes through the pinhole and the light of +1 or −1 order passes through the window.

The beams of light of the other orders are all shielded by a light shielding portion of the second mask 28.

The light diffracted by the pinhole of the second mask 28 can be regarded as a substantially ideal spherical wave and is deprived of wavefront aberration information of the tested optical system 31. On the other hand, the light having passed through the window of the second mask 28 contains the wavefront aberration information of the tested optical system 31.

An interference fringe (interference pattern) produced by those two beams of light is observed by the CCD 30 serving as the detector. A method of measuring the wavefront aberration of the tested optical system from the interference fringe can be practiced as the so-called electronic moiré method using one pattern of interference fringe superimposed with a tilt fringe, or the so-called Fourier transform method. Another practicable option is to employ the so-called fringe scan method in which plural patterns of interference fringes are obtained by the CCD 30 while scanning the first diffraction grating 26 in a direction perpendicular to an optical axis.

The LDI (Line Diffraction Interferometer) includes employing, instead of the pinholes, slits as the first mask 25 and the second mask 28 in the arrangement of FIG. 8A. In the case of the LDI, since the amounts of light passing the first mask 25 and the second mask 28 are increased, the measurement can be easily performed even when the light source has a low luminance.

The LSI will be described with reference to FIG. 8B. The light 21 from the light source illuminates the first mask 25. The first mask 25 has a pinhole formed therein with a diameter of not larger than the diffraction limit.

The light diffracted by the pinhole of the first mask 25 passes the tested optical system 31 and then enters the second diffraction grating 27. The second diffraction grating 27 diffracts the light outgoing from the tested optical system 31 to form a plurality of light-condensed points on the second mask 28. The second mask 28 has two order-selection windows formed therein with a size of sufficiently larger than the diffraction limit such that only beams of light of ±1 order among the light diffracted by the second diffraction grating 27 are facilitated to pass the windows. The beams of light having passed the second mask 28 interfere with each other, and an interference fringe is observed by the CCD 30. Phase information can be obtained from the interference fringe by using the electronic moiré method or the fringe scan method. The thus-obtained phase information represents a differential value of the wavefront aberration of the projection optical system (tested optical system 31) in one direction (e.g., a differential value in the x-direction). After rotating the second diffraction grating 27 and the second mask 28 through 90° about the optical axis, an interference fringe is similarly observed by the CCD 30 and phase information is obtained in the rotated state. The thus-obtained phase information represents a differential value of the wavefront aberration of the tested optical system 31 in the y-direction. The information regarding the wavefront aberration of the tested optical system 31 can be obtained from those differential values of the phase information in the two x- and y-directions.

While the first mask 25, which can have the pinhole, is employed in the above description, a slit 25' or 25" extending in parallel to the second diffraction grating 27 in each rotated state thereof can be formed in the first mask.

Alternatively, in the interferometer of FIG. 8B, the second diffraction grating 27 and the second mask 28 can be replaced respectively with a two-dimensional grating 27a, e.g., a cross-grating, and a mask 28a having four order-selection windows with a size of sufficiently larger than the diffraction limit. This arrangement enables the information regarding the wavefront aberration of the tested optical system 31 in the two x- and y-directions to be obtained contemporaneously.

The projection optical system used in the EUV exposure apparatus is highly sensitive to position accuracy and heat-induced deformations of the mirrors forming the projection optical system. It is therefore required to ensure the performance of the projection optical system in the exposure apparatus through, e.g., feedback control of measuring the wavefront aberration of the projection optical system and adjusting the mirror positions during an interval between the exposure operations.

Also, impurities can attach to or cause chemical changes of the Mo/Si multilayered film coated on the mirror, and can bring about phase changes, due to the so-called contamination. This necessitates measuring the optical performance of the projection optical system in the exposure apparatus at the exposure wavelength used in practice.

In connection with such measurement, the inventor has found the following. When trying to mount, in the EUV exposure apparatus, a measuring unit (e.g., an interferometer) for measuring optical characteristics of the projection optical system therein, one conceivable solution is to arrange, as the first mask, a mask, which can have a reflection area in the form of a pinhole or a slit instead of the usually employed reflection mask. However, such an arrangement cannot provide the amount of light sufficient to measure the optical characteristics of the projection optical system.

The reason is that, in the illumination optical system of the EUV exposure apparatus, because secondary light sources are formed using an integrator and beams of light from the secondary light sources are superimposed with one another on an illuminated plane to perform uniform Koehler illumination on a reflection mask, the illuminance on the illuminated plane is generally reduced.

Accordingly, an exposure apparatus is demanded which enables illumination to be performed in a manner suitable for any type of mask regardless of which one of plural types of masks (e.g., a transmission mask, a reflection mask, and a plurality of reflection masks having different pattern areas from one another) is disposed in the object plane of the projection optical system in the exposure apparatus.

SUMMARY OF THE INVENTION

At least one exemplary embodiment is directed to an exposure apparatus which enables illumination to be performed in a manner suitable for any type of mask regardless of which one of plural types of masks. At least one further exemplary embodiment of the present invention provides an exposure apparatus comprising an illumination optical system adapted to illuminate a reflection mask with light from an exposure light source; and a projection optical system adapted to project a pattern image of the reflection mask disposed in an object plane onto a substrate disposed in an image plane, where the illumination optical system includes a reflection integrator adapted to form a plurality of secondary light sources with the light from the exposure light source, a condenser unit adapted to superimpose beams of light from the plurality of secondary light sources with one another on the reflection mask, and a mirror capable of being disposed in an optical path instead of the reflection integrator, and wherein when the mirror is disposed in the optical path instead of the reflection integrator, an illuminated area formed in the object plane of the projection optical system is reduced in comparison with an illuminated area formed when the reflection integrator is disposed in the optical path.

At least one further exemplary embodiment of the present invention provides an exposure apparatus comprising an illumination optical system adapted to illuminate a reflection mask with light from an exposure light source; a projection optical system adapted to project a pattern image of the reflection mask disposed in an object plane onto a substrate disposed in an image plane; and a mirror adapted to introduce the light from the illumination optical system to a transmission mask disposed in the object plane of the illumination optical system instead of the reflection mask.

Other features of the present invention will be apparent from the following description taken in conjunction with the accompanying drawings, in which like reference characters designate the same or similar parts throughout the figures.

BRIEF DESCRIPTION OF THE DRAWINGS

The accompanying drawings, which are incorporated in and constitute a part of the specification.

DESCRIPTION OF THE EMBODIMENTS

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication of the lens elements and their materials.

In all of the examples illustrated and discussed herein any specific values should be interpreted to be illustrative only and non limiting. Thus, other examples of the exemplary embodiments could have different values.

Notice that similar reference numerals and letters refer to similar items in the following figures, and thus once an item is defined in one figure, it may not be discussed for following figures.

Exemplary embodiments of the present invention will now be described in detail in accordance with the accompanying drawings.

First Exemplary Embodiment

Figure 1:
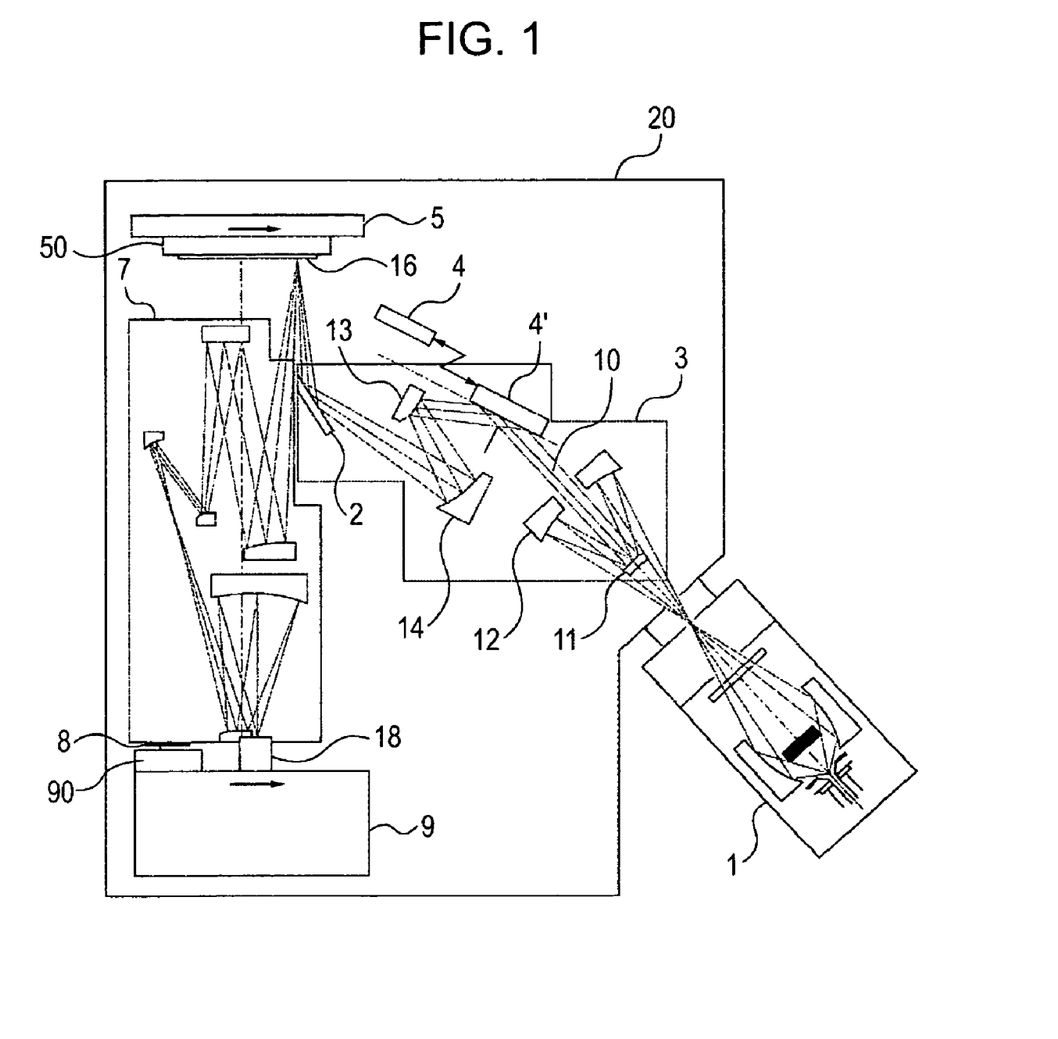
FIG. 1 is a schematic view of an exposure apparatus according to a first exemplary embodiment.

FIG. 1 shows a schematic view of an exposure apparatus according to a first exemplary embodiment. In FIG. 1, the same parts as those described above for the exposure apparatus of FIG. 2 are denoted by the same reference characters.

An exposure light source unit 1 emits EUV light, as an exposure light, which can have a wavelength of 13.4 nm, and the emitted light enters an illumination optical system 3. In the illumination optical system 3, the EUV light from the light source unit 1 is converted to substantially parallel light by a parallel conversion unit 11 and 12, and then enters a plane mirror 4'. After being reflected by the plane mirror 4', the light is further reflected by a condenser unit 13, 14 and 2, and is condensed onto an object plane of a projection optical system 7. An angle of the plane mirror 2 is adjusted such that the light from the illumination optical system 3 is incident upon a reflection mask at a predetermined angle. In this exemplary embodiment, the incident angle is set to about 6°, that is equal to an angle formed between a corresponding principal ray in the object side of the projection optical system 7 and a normal line with respect to a mask surface.

The light from the illumination optical system 3 enters a first mask 16 disposed as a test mask dedicated for measuring a wavefront aberration. The dedicated test mask is held, instead of a reflection mask for exposure, by a mask chuck 50 provided on a mask stage 5. Alternatively, the first mask 16 can be disposed adjacent to the mask chuck 50 on the mask stage 5 such that the first mask 16 is positioned in an optical path instead of the reflection mask for exposure by movement of the mask stage 5.

The first mask 16 has a reflection pattern formed as a reflection area in the form of a pinhole or a slit which is related to that formed in the first mask 25 shown in FIGS. 8A and 8B. The other area of the first mask 16 shields the light. The light reflected by the reflection area is converted, as in the related art shown in FIGS. 8A and 8B, to a substantially ideal spherical wave when the reflection area is a pinhole, or to have a wavefront shaped in one direction when the reflection area is a slit.

In this exemplary embodiment, the illumination optical system 3 is constructed such that, when the wavefront aberration is measured, an integrator 4 is replaced with the plane mirror 4' by a mirror changing-over unit (not shown), and the first mask 16 is disposed in an object plane of the projection optical system 7. With that replacement, the object plane of the projection optical system 7 (i.e., the first mask 16 disposed therein), which has been subjected to Koehler illumination in a circular arc shape by the light from the light source unit 1, comes into conjugate relation to a light emitting point of the light source unit 1 and is subjected to critical illumination in a spot shape. Thus, light having higher intensity enters the pinhole- or slit-shaped reflection area of the first mask 16 and the amount of the EUV light from the exposure light source, which is shielded by the first mask 16, is reduced, whereby more efficient illumination is realized.

The light reflected by the first mask 16 passes through the projection optical system 7 and is focused in the image side.

Figure 9:
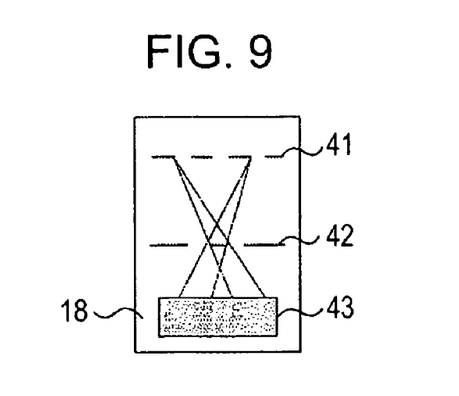
FIG. 9 is an explanatory view of a wafer-side unit.

In the image side, a wafer-side unit 18 is disposed on a wafer stage 9 for holding a wafer, i.e., a substrate subjected to the exposure. Details of the wafer-side unit 18 are shown in FIG. 9. The wafer-side unit 18 comprises a diffraction grating 41 (corresponding to the diffraction grating 27 in FIG. 8B), a second mask 42 (corresponding to the second mask 28) having two order-selection windows, and a CCD 43 (corresponding to the CCD 30 in FIG. 8B) serving as a detector.

The beams of light diffracted by the diffraction grating 41 pass the second mask 42 such that the light beams of particular orders reach the CCD 43. Because an interference fringe (interference pattern) formed by the light beams of particular orders is observed by the CCD 43, the wavefront aberration of the projection optical system 7 can be measured based on the principle of shearing interference by using known methods. Additionally, a two-dimensional diffraction grating, such as the cross-grating shown in FIG. 8B, can be employed as the diffraction grating 41. The arrangement related to that shown in FIG. 8A can also be obtained by disposing the diffraction grating 41 between the first mask and the projection optical system 7.

The arrangement of the PDI can be obtained by employing, instead of the second mask 42 having two order-selection windows, a mask, which can have a pinhole and a window, such as the second mask 42 shown in FIG. 8A, in the wafer-side unit 18 of FIG. 9. Further, a slit can be used instead of the pinhole. This replacement provides the LDI.

The phase information can be taken from the interference fringe by the so-called electronic Moiré method using one pattern of interference fringes. The phase information can also be taken by the so-called fringe scan method of obtaining plural patterns of interference fringes with the CCD 43 (Note other image pickup apparatus can be used such as CMOS) while the wafer-side unit 18 is scanned in the direction perpendicular to the optical axis.

When measuring the wavefront aberration at a plurality of object points (or image points) in the exposure area of the projection optical system 7, the integrator 4 is replaced with the plane mirror 4', and thereafter a beam-condensed spot is successively moved to all measuring points in an arc-shaped area by rotating (tilting) the plane mirror 4' about an axis parallel to the drawing sheet and the plane mirror 4' itself and rotating (tilting) the folding mirror 2 about an axis perpendicular to the drawing sheet. In that case, the first mask and the wafer-side unit are moved to each of the measuring points within the arc-shaped area corresponding to the movement of the beam-condensed spot.

With the movement of the beam-condensed spot, the beam-condensed spot can blur to some extent. However, such a blur causes no significant problem because it is just essential that a substantially ideal spherical wave is generated from the pinhole- or slit-shaped reflection area disposed in the object plane of the projection optical system 7.

Figure 6A:
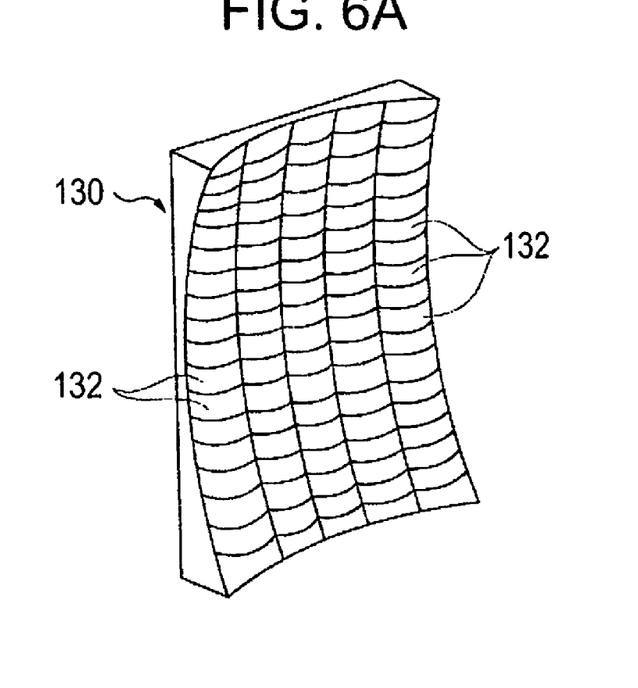
FIG. 6A is a perspective view of an integrator including a plurality of mirrors.
Figure 6B:
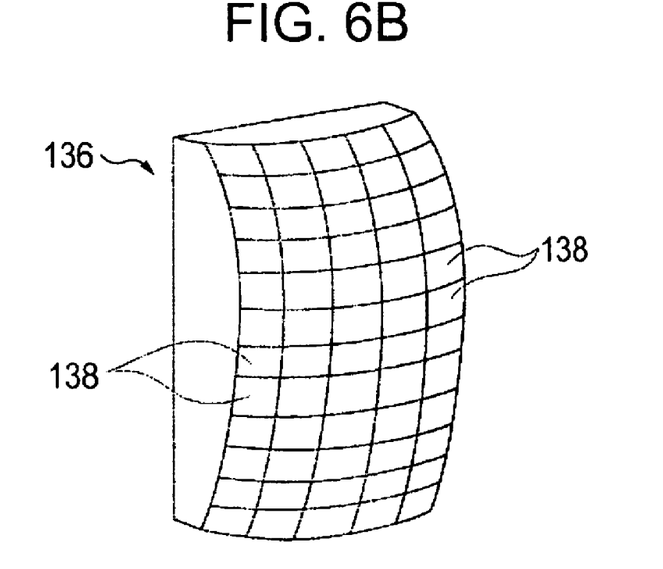
FIG. 6B is a perspective view of an integrator including a plurality of mirrors.

The exposure apparatus of the illustrated embodiment employs the integrator 4 constituted by one mirror which has a plurality of cylindrical surfaces, i.e., which includes a plurality of reflection elements (having cylindrical surfaces). As another example, the integrator can comprise a first mirror 130, which can have a plurality of arc-shaped reflection elements 132 as illustrated in FIG. 6A, and a second mirror 136, which can have a plurality of rectangular (or square) reflection elements 138 as illustrated in FIG. 6B (see, e.g., U.S. Pat. No. 6,452,661 for more details). In that case, the pinhole- or slit-shaped reflection area of the first mask 16 can be efficiently illuminated by replacing each of the first mirror 130 and the second mirror 136 with any of a plane mirror, a concave mirror and a convex mirror which do not form a plurality of secondary light sources. In other words, FIGS. 6A and 6B show examples of an integrator including a plurality of mirrors.

While the integrator 4 is replaced with the plane mirror 4' in the illustrated embodiment, it can be replaced with a concave mirror or a convex mirror instead of the plane mirror 4'. In that modified case, the illuminated area blurs to some extent in the object plane of the projection optical system 7. However, such a blur causes no significant problem because it is just essential that a substantially ideal spherical wave is finally generated from the pinhole-shaped reflection area, Further, in the illustrated embodiment, an interferometer for measuring the wavefront aberration of the projection optical system is employed as the measuring unit for measuring the optical characteristics of the projection optical system. However, a focus detecting unit for detecting the focal point of the projection optical system can also be used as the measuring unit. In that case, the first mask and the second mask are formed of, e.g., patterns of lines and spaces corresponding to each other, and a photodiode is used as the photoelectric detector instead of the CCD without arranging the diffraction gratings in the optical path (see, e.g., Japanese Patent Laid-Open No. 08-298238 for more details).

According to this exemplary embodiment, as described above, the light source for exposure is used as a light source for the measuring unit for measuring the optical characteristics of the projection optical system, and optical components of the illumination optical system in the exposure apparatus are used to illuminate the pattern of the first mask in the measuring unit. Therefore, the overall size of the exposure apparatus can be made compact.

Also, in the measurement using the measuring unit, the integrator disposed in the illumination optical system to form the secondary light sources is replaced with a mirror not forming the secondary light sources such that a target mark (such as a pinhole, a slit, or a line-and-space pattern) formed in the first mask of the measuring unit is illuminated with higher efficiency. Therefore, the optical characteristics of the projection optical system can be more easily measured.

Second Exemplary Embodiment

Figure 10:
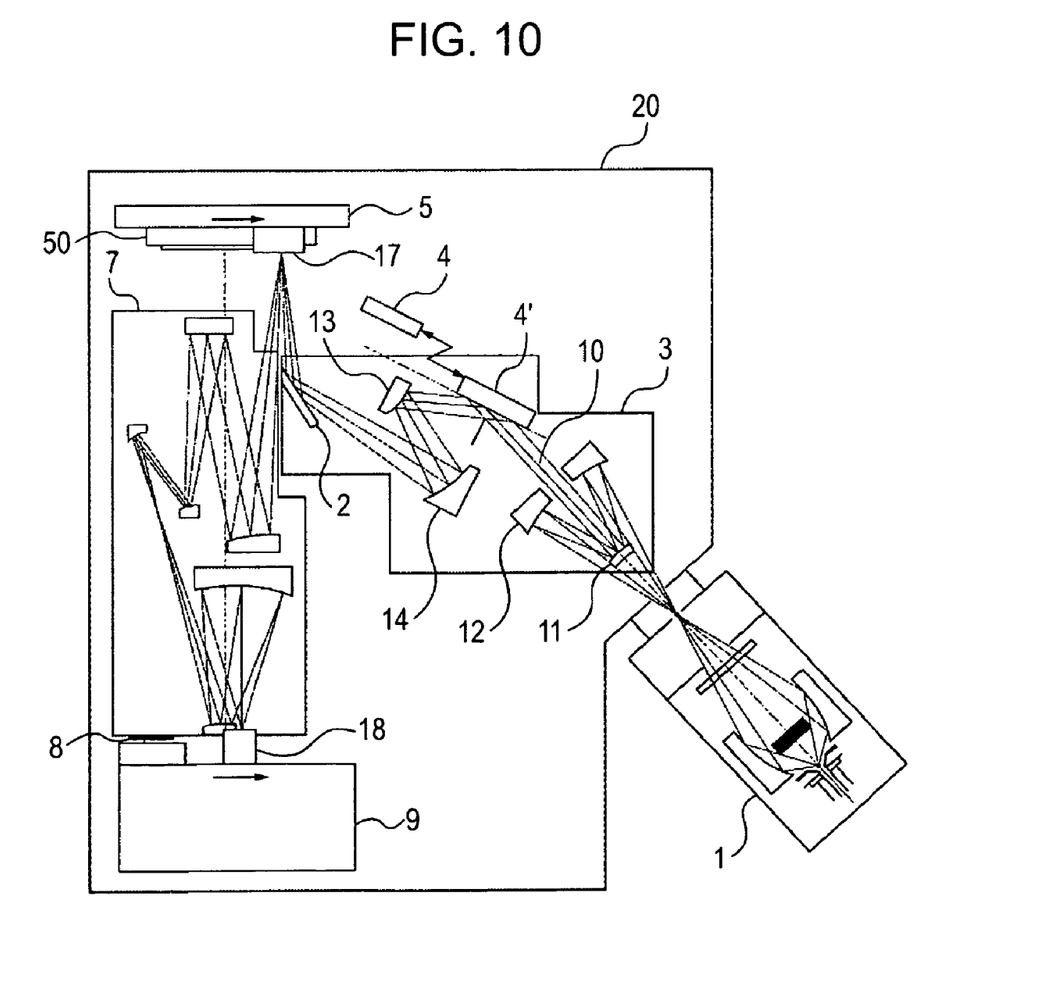
FIG. 10 is a schematic view of an exposure apparatus according to a second exemplary embodiment.

FIG. 10 schematically shows an exposure apparatus according to a second exemplary embodiment of the present invention. In FIG. 10, the same parts as those in the exposure apparatus of FIG. 1 are denoted by the same reference characters.

EUV light emitted from an exposure light source unit 1 enters an illumination optical system 3. In the illumination optical system 3, the EUV light from the light source unit 1 is converted to substantially parallel light by a parallel conversion unit 11 and 12, and then enters a plane mirror 4'. After being reflected by the plane mirror 4', the light is condensed onto an object plane of a projection optical system 7 through a condenser unit 13, 14 and 2. An angle of the plane mirror 2 is adjusted such that the light from the illumination optical system 3 is incident upon a reflection mask at a predetermined angle. In this exemplary embodiment, the incident angle is set to about 6° that are equal to an angle formed between a corresponding principal ray in the object side of the projection optical system 7 and a normal line with respect to a mask surface.

The light from the illumination optical system 3 enters a mask-side unit 17. The mask-side unit 17 constitutes a test mask dedicated for measuring a wavefront aberration. The mask-side unit 17 can be attached to a mask chuck 50 provided on a mask stage 5. Alternatively, as illustrated in FIG. 10, the mask-side unit 17 can be disposed adjacent to the mask chuck 50 on the mask stage 5.

Figure 11:
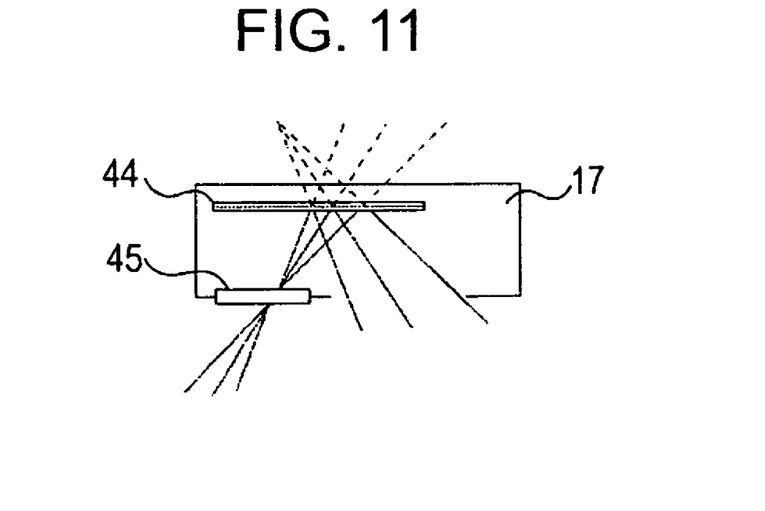
FIG. 11 is a schematic view of a mask-side unit.

FIG. 11 shows details of the mask-side unit 17.

Note that, in FIG. 11, angles of light beams in the mask-side unit 17 are illustrated in an enlarged scale for the sake of explanation.

While a reflection mask is used as the first mask in the first exemplary embodiment, this second exemplary embodiment can use a transmission mask which can be more easily manufactured than the reflection mask. Further, in this second exemplary embodiment, the mask-side unit 17 includes a mirror 44 in addition to a first mask 45 of the transmission type. The light emitted from the light source unit 1 and advanced upward to the mask stage 5 after passing the illumination optical system is reflected by the mirror 44 such that the light advances toward the a wafer stage 9. Thus, the provision of the mirror 44 enables the use of the first transmission mask 45.

Figure 12:
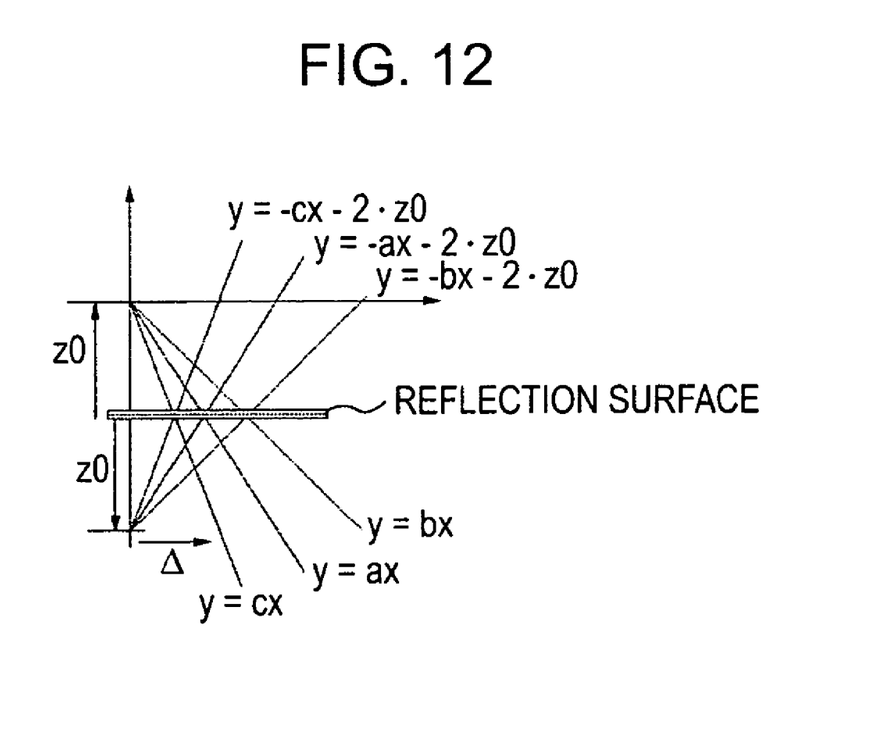
FIG. 12 is an explanatory view for explaining separation of light beams in the mask-side unit.

The spacing between the mirror 44 and the transmission mask 45 and vignetting of the light will be described below with reference to FIG. 12. Note that the NA in the object side can be 0.0625, the angle of the principal ray is 6°, and the transmission mask 45 is spaced from the mirror 44 (i.e., the reflection surface in FIG. 12) by a distance of z0.

Note that the principal ray can be defined by a linear line of y=ax (a=tan(90°−6°), and light rays at extreme ends of the NA are defined by y=bx and y=cx, respectively. The light coming from the illumination optical system (not shown in FIG. 12) is reflected by the mirror 44 of the mask-side unit 17 and is condensed onto a patterned surface of the transmission mask 45 in which a transmission pattern is formed. At that time, a beam-condensed point requires to be sufficiently separated from the light from the illumination optical system. In other words, the linear line of y=cx and the beam-condensed point have to be spatially apart from each other. Table 1, given below, illustrates the separation distance Δ resulting when the transmission mask 45 is positioned at different distances z0 from the reflection surface.

TABLE 1

| z0(mm) | Δ(mm) |
|---|---|
| 5 | 0.40 |
| 10 | 0.79 |
| 20 | 1.59 |

It is thus understood that the light beams can be sufficiently separated from each other even when the NA in the image side of the projection optical system is 0.25 (or the NA in the object side is 0.0625).

As a matter of course, the arrangements described above in connection with the first exemplary embodiment can also be all applied to this second exemplary embodiment. According to the exposure apparatus of this second exemplary embodiment, since the transmission mask capable of being more easily manufactured than the reflection mask is used as the first mask in the measuring unit for measuring the optical performance of the projection optical system, the optical performance of the projection optical system can be more easily measured.

Third Exemplary Embodiment

In the second exemplary embodiment, the distance from the condenser unit to the object plane of the projection optical system 7 is increased in an amount corresponding to the arrangement that the light is reflected by the mirror 44 in the mask-side unit 17 shown in FIG. 11. Therefore, the light beam from the illumination optical system 3 is condensed short of the first transmission mask 45 and is not focused on the first mask 45. Hence the beam-condensed spot on the first mask 45 is blurred and becomes equivalently wide. However, such a blur causes no significant problem because it is just essential that a substantially ideal spherical wave is generated from the pinhole or the slit disposed in the object plane of the projection optical system 7.

Nevertheless, in view of that blur, this third exemplary embodiment is intended to further increase the amount of light usable in measuring the optical performance of the projection optical system by employing a convex mirror having negative power instead of the plane mirror 4' shown in FIG. 10. The use of the convex mirror increases the distance up to a focused position such that the first mask 45 and the exposure light source can be held in conjugate relation even when the mirror 44 of the mask-side unit 17 is employed. Thus, the light beam can be focused on the first mask 45. The other arrangement is the same as that in the exposure apparatus of the second exemplary embodiment and therefore a detailed description thereof is omitted here.

While the convex mirror having negative power is employed instead of the plane mirror 4' in this exemplary embodiment, the first mask 45 and the exposure light source can also be held in conjugate relation by forming the mirrors 13 and 14 of the condenser unit in the form of a zoom optical system, which has an adjustable focal length, even when the mirror 44 of the mask-side unit 17 is employed. Furthermore, the mirrors 13 and 14 of the condenser unit can be replaced with mirrors having different focal lengths.

As a matter of course, the arrangements described above in connection with the first exemplary embodiment can also be all applied to this third exemplary embodiment. According to this third exemplary embodiment, even with the transmission mask used in the measuring unit constituted by an interferometer, for example, the illuminated plane of the illumination optical system can be substantially matched with the first mask placed in the object plane of the projection optical system, whereby the mask pattern of the measuring unit can be illuminated with higher efficiency.

Further, according to the embodiment described above, an exposure apparatus is provided which can perform illumination suitable for any type of mask even when plural types of masks (e.g., a transmission mask and a reflection mask, or a plurality of reflection masks having different pattern areas from each other) are disposed in the object plane of the projection optical system in the exposure apparatus.

Fourth Exemplary Embodiment

An embodiment for a method of manufacturing a device by employing the above-described exposure apparatus will be described below.

Figure 4:
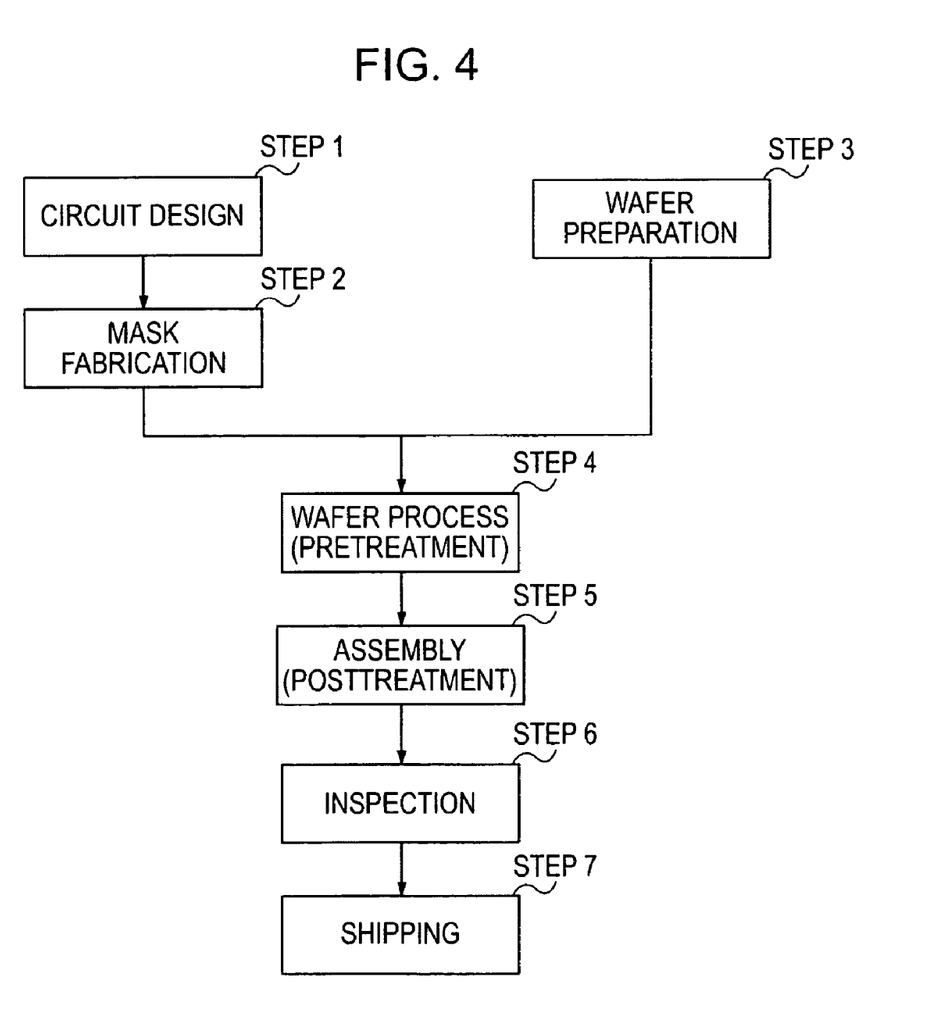
FIG. 4 is a flowchart showing a device manufacturing flow.

FIG. 4 shows a flowchart for manufacturing a semiconductor device (e.g., a semiconductor chip such as an IC and LSI). In step 1 (circuit design), circuit design of the semiconductor device is performed. In step 2 (mask fabrication), a mask (reticle), which can have a designed circuit pattern is fabricated. On the other hand, in step 3 (wafer preparation), a wafer is prepared using a material such as silicon. Step 4 (wafer process) is called a pretreatment step where the circuit is actually formed on the wafer based on the lithography technology by using the mask and the wafer both prepared in the preceding steps. Next step 5 (assembly) is called a post-treatment step where a chip is assembled by using the wafer obtained in the step 4. The step 5 includes an assembly step (dicing and bonding), a packaging step (chip sealing) In step 6 (inspection), the semiconductor device obtained in the step 5 is inspected by an operation check test, a durability test, The semiconductor device is completed through those steps and then shipped (step 7).

Figure 5:
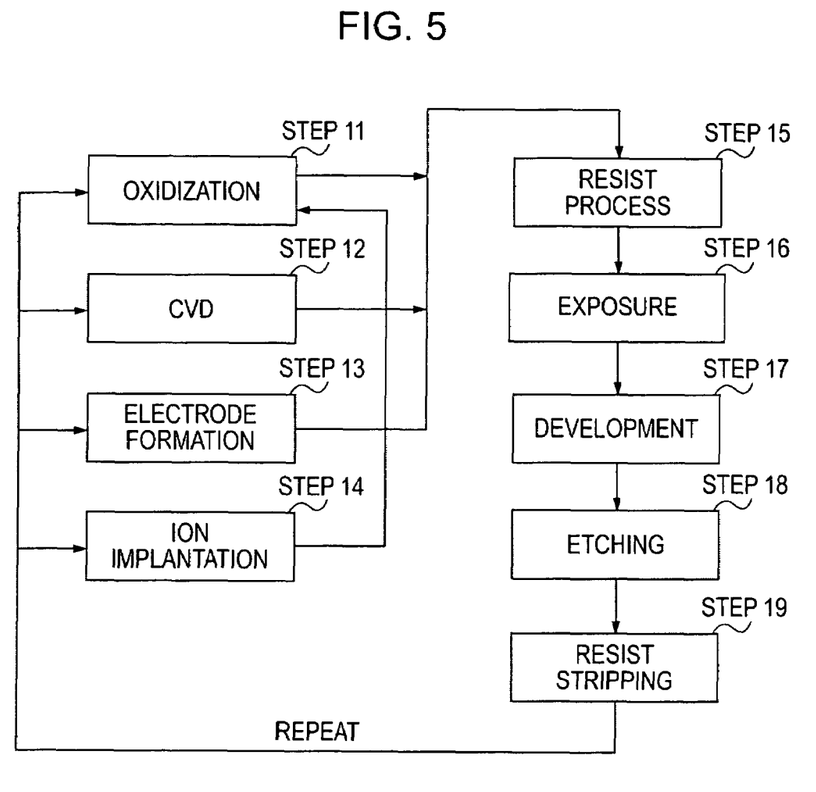
FIG. 5 is a flowchart showing a wafer process in FIG. 4.

FIG. 5 shows a detailed flow of the wafer process. In step 11 (oxidization), the wafer surface is oxidized. In step 12 (CVD), an insulating film is formed on the wafer surface. In step 13 (electrode formation), electrodes are formed on the wafer by vapor deposition. In step 14 (ion implantation), ions are implanted into the wafer. In step 15 (resist process), a resist (sensitive material) is coated on the wafer. In step 16 (exposure), the wafer is subjected to exposure in accordance with an image of the circuit pattern on the mask by using the above-described projection exposure apparatus. In step 17 (development), the wafer having been subjected to the exposure is developed. In step 18 (etching), the other areas than the developed resist are etched away. In step 19 (resist stripping), the resist remaining after the etching is removed. A desired circuit pattern is formed on the wafer by repeatedly carrying out those steps.

By employing the manufacturing method of this exemplary embodiment, it is possible to manufacture a device with higher integration, which has been difficult to realize in the past.

As many apparently widely different embodiments of the present invention can be made without departing from the spirit and scope thereof, it can be understood that the invention is not limited to the specific embodiments described above. Alternative means known to a person skilled in the art can be substituted if desired.

This application claims the priority benefit of Japanese Patent Application No. 2005-126391 filed on Apr. 25, 2005 which is incorporated herein by reference in its entirety.

What is claimed is:

1. An exposure apparatus comprising:
an illumination optical system adapted to illuminate a reflection mask with light from an exposure light source; and
a projection optical system adapted to project a pattern image of the reflection mask disposed in an object plane onto a substrate disposed in an image plane,
wherein the illumination optical system includes a reflection integrator adapted to form a plurality of secondary light sources with the light from the exposure light source, a condenser unit adapted to superimpose beams of light from the plurality of secondary light sources with one another on the reflection mask, and a mirror capable of being disposed in an optical path instead of the reflection integrator,
wherein the reflection integrator and the condenser unit are arranged so that the object plane of the projection optical system is subjected to Koehler illumination by the light from the exposure light source, and
wherein when the mirror is disposed in the optical path instead of the reflection integrator, an illuminated area formed in the object plane of the projection optical system is reduced in comparison with an illuminated area formed when the reflection integrator is disposed in the optical path.

2. The exposure apparatus according to claim 1, further comprising a measuring unit adapted to measure optical characteristics of the projection optical system by using the light from the exposure light source,
wherein the measuring unit includes a first mask disposed in the object plane of the projection optical system, the first mask being illuminated when the mirror is disposed in the optical path.

3. The exposure apparatus according to claim 2, wherein the measuring unit further includes a second mask adapted to restrict the light from the projection optical system, and a detector adapted to detect the light from the exposure light source after passing the first mask, the projection optical system, and the second mask successively in the order named.

4. The exposure apparatus according to claim 3, wherein the measuring unit further includes a diffraction grating disposed between the projection optical system and the second mask,
the first mask includes a pinhole-shaped reflection area and the second mask has two openings, and
the detector detects an interference pattern formed through the process that the light from the exposure light source is reflected by the pinhole-shaped reflection area of the first mask to become a substantially ideal spherical wave, which is diffracted by the diffraction grating after passing the projection optical system, and beams of diffracted light of predetermined orders pass the two openings of the second mask and interfere with each other.

5. The exposure apparatus according to claim 1, wherein the mirror comprises a plane mirror.

6. The exposure apparatus according to claim 1, wherein a position of the illuminated area formed in the object plane of the projection optical system is changed by tilting the mirror.

7. The exposure apparatus according to claim 1, wherein the condenser unit further includes a plane mirror, and
a position of the illuminated area formed in the object plane of the projection optical system is changed by tilting the plane mirror.

8. The exposure apparatus according to claim 2, wherein the measuring unit comprises an interferometer.

9. The exposure apparatus according to claim 2, wherein the measuring unit comprises a focus detecting unit.

10. The exposure apparatus according to claim 1, wherein the reflection integrator includes a first mirror having a plurality of first reflection elements and a second mirror having a plurality of second reflection elements.

11. The exposure apparatus according to claim 1, wherein the mirror disposed instead of the reflection integrator includes a plurality of mirrors.

12. A device manufacturing method comprising the steps of:
subjecting a substrate to exposure by using the exposure apparatus according to claim 1; and
developing the substrate having been subjected to the exposure.

* * * * *